(12) United States Patent
Templeton et al.

(10) Patent No.: US 7,968,907 B2
(45) Date of Patent: Jun. 28, 2011

(54) LOW CAPACITANCE OVER-VOLTAGE PROTECTION THYRISTOR DEVICE

(75) Inventors: George Templeton, Tempe, AZ (US); James Washburn, Scottsdale, AZ (US)

(73) Assignee: Pan Jit Americas, Inc., Tempe, AZ (US)

( * ) Notice: Subject to any disclaimer, the term of this patent is extended or adjusted under 35 U.S.C. 154(b) by 148 days.

(21) Appl. No.: 12/314,375

(22) Filed: Dec. 9, 2008

(65) Prior Publication Data
US 2009/0095978 A1 Apr. 16, 2009

Related U.S. Application Data

(63) Continuation of application No. 11/273,609, filed on Nov. 15, 2005, now abandoned, and a continuation of application No. PCT/US2004/015033, filed on May 14, 2004.

(60) Provisional application No. 60/470,421, filed on May 15, 2003.

(51) Int. Cl.
*H01L 21/70* (2006.01)
(52) U.S. Cl. ........ 257/173; 257/112; 257/119; 257/130; 257/157; 257/E21.515; 257/E23.187
(58) Field of Classification Search ................ 257/112, 257/119, 130, 155, 157, 173, 603, 914
See application file for complete search history.

(56) References Cited

U.S. PATENT DOCUMENTS

| | | | |
|---|---|---|---|
| 3,727,116 A * | 4/1973 | Thomas et al. ............. 257/121 |
| 4,402,004 A * | 8/1983 | Iwasaki ....................... 257/689 |
| 6,862,162 B2 * | 3/2005 | Casey ......................... 361/91.1 |
| 2002/0134991 A1* | 9/2002 | Casey et al. ................. 257/109 |

* cited by examiner

*Primary Examiner* — A. Sefer

(57) ABSTRACT

An over-voltage protection thyristor has reduced junction capacitance making it suitable for use in high bandwidth applications. The reduced capacitance is achieved through the introduction of a deep base region. The deep base region has a graded doping concentration which reduces with depth into the substrate. The thyristor is useful for protecting sensitive electrical equipment from transient surges.

24 Claims, 2 Drawing Sheets

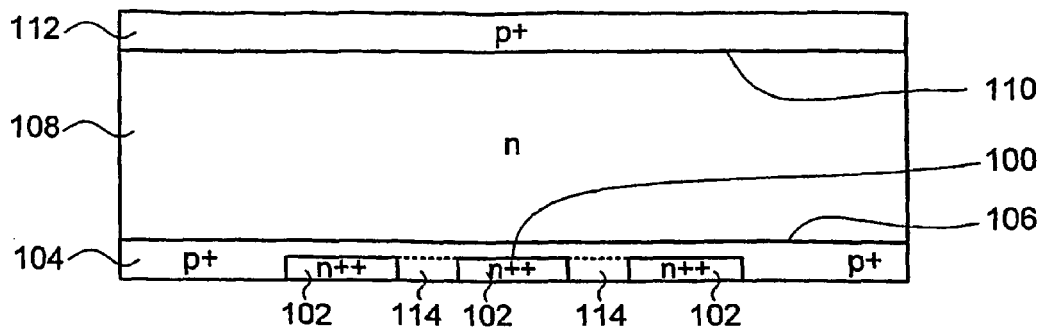
FIG. 1-A
PRIOR ART
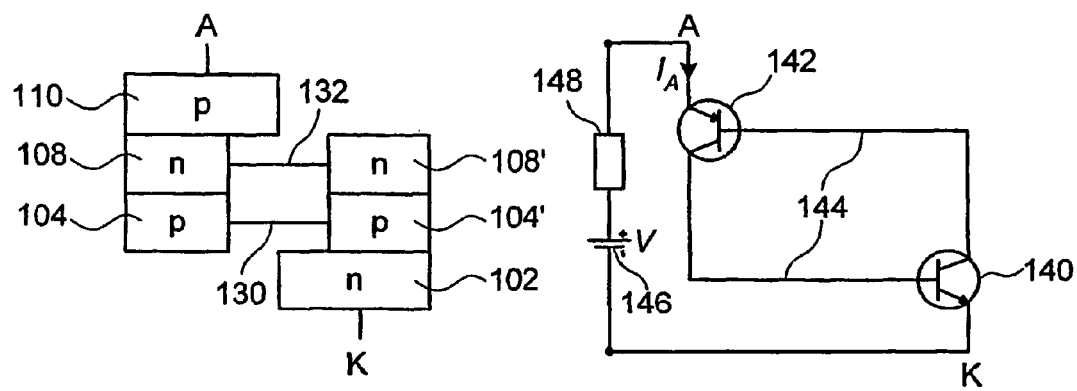
FIG. 1-B
PRIOR ART
FIG. 1-C
PRIOR ART

LOW CAPACITANCE OVER-VOLTAGE PROTECTION THYRISTOR DEVICE

This application claims benefit of the filing date of U.S. Application 60/470,421 provisionally filed on May 15, 2003.

The invention relates to the field of active solid state semiconductor devices and more particularly to a thyristor switching device.

BACKGROUND OF THE INVENTION

Specialized thyristor semiconductor devices have been widely used to protect electrical equipment from line transient conditions, such as those induced by lightning strikes and power line crossings. Equipment used in data and voice communication systems is particularly sensitive to such transient conditions, although in practice many other electronic systems suffer similar sensitivities. Devices used to suppress transients are commonly referred to as Over-Voltage Protection (OVP) devices or Thyristor Surge Protection Devices (TSPD's).

OVP Thyristors have a relatively large junction area in order to withstand the typical peak currents present in a transient. The large junction area results in high junction capacitance limiting the use of OVP thyristors in some high bandwidth applications. Gas discharge tubes are more often used in high bandwidth OVP applications; an older technology having desirable low capacitance effects, but generally less reliable than solid-state devices such as thyristors.

A thyristor OVP device is generally supplied as a two terminal device for insertion between a pair of conductors. The device is often segmented into a pair of anti-parallel devices, one device for conducting a transient current of one polarity, and the other to conduct in the opposite polarity. In contrast to a common thyristor, an OVP thyristor is usually gateless, the triggering occurring via avalanche breakdown. U.S. Pat. No. 5,281,832 to Clark et al, describes an example of a bidirectional un-gated OVP thyristor.

In general, in solid-state devices, and in particular in thyristors, there have been no abrupt or quantum improvements specifically intended to lower capacitance; rather, continuous improvements have been made within a conventional design domain.

SUMMARY OF THE INVENTION

The invention provides a reduced capacitance OVP thyristor device by introducing a deep base region with a graded concentration.

In a first aspect of the present invention an over-voltage protection thyristor device has a substrate semiconductor material of a first conductivity type. The substrate has a first outer surface and a second outer surface. A shallow base region of a second conductivity type extends from the first outer surface into the substrate. An emitter of the first conductivity type extends from the first outer surface into the shallow base region. The emitter has a depth that is less than the shallow base region. A deep base region of the second conductivity type extends into the substrate from the second outer surface. The deep base region has a graded concentration reducing into the substrate such that the capacitance between the deep base region and the substrate is reduced.

In another aspect the present invention provides a method of fabricating an over-voltage protection thyristor device on a substrate semiconductor material of a first conductivity type. The substrate has a first outer surface and a second outer surface. The method involves forming a shallow base region of a second conductivity type extending from the first outer surface into the substrate. An emitter of the first conductivity type is formed extending from the first outer surface into the shallow base region. The emitter has a depth that is less than the shallow base region. A deep base region of the second conductivity type is formed extending into the substrate from the second outer surface. The deep base region has a graded concentration reducing into the substrate such that the capacitance between the deep base region and the substrate is reduced.

BRIEF DESCRIPTION OF THE DRAWINGS

Embodiments of the present invention will now be described by way of example only with reference to the following drawings in which:

FIG. 1-A is a cross sectional view of a prior art OVP thyristor;

FIG. 1-B is a schematic view of the OVP thyristor of FIG. 1-A;

FIG. 1-C is a schematic circuit diagram corresponding to the OVP thyristor of FIG. 1-A and FIG. 1-B;

DETAILED DESCRIPTION OF THE PREFERRED EMBODIMENTS

Figure 2:
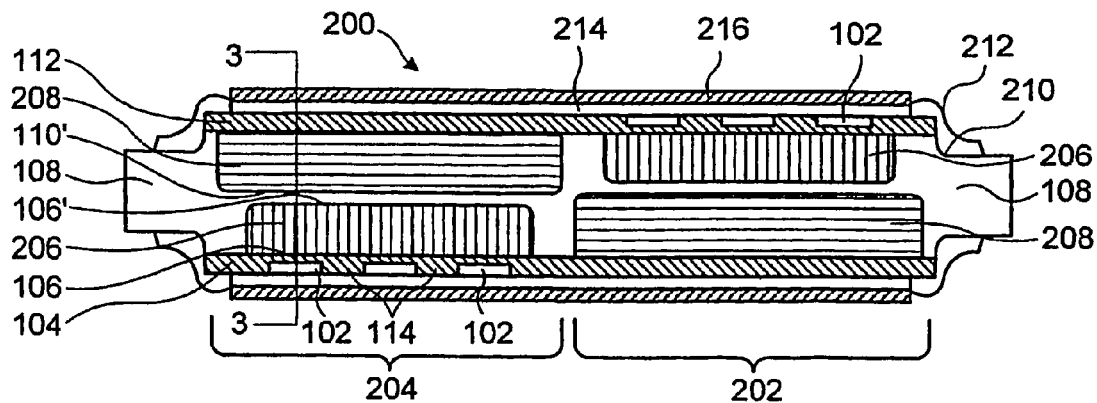
FIG. 2 is a cross sectional view of an OVP thyristor in accordance with an embodiment of the present invention.

For an understanding of the invention, reference will now be made by way of example to a following detailed description in conjunction with the accompanying drawings wherein like numerals refer to like structures.

The purpose of the present invention is to lower the capacitance of an OVP semiconductor device, such as a bilaterally conducting, voltage fired thyristor, while simultaneously preserving and/or enhancing switching performance.

The portion of the chip used in firing requires a particular doping concentration or combination of doping concentrations to form a blocking junction, the breakdown of which sets the desired voltage threshold for particular applications. The sub-portion (including a junction of the same polarity types) of the opposite region which is in contact with, or is continuous with, the breakdown junction of the firing portion need not be constrained to identical or similar doping concentrations.

Accordingly, the present invention employs, in a non-active region, a substantially less steeply graded concentration, along with a more nearly intrinsically doped substrate (wide base region) and, finally with a deep anode diffusion to retain an efficient charge injection and provide lowered device capacitance. Accordingly, simple refinements in geometries can be made to accomplish or adjust the desired electrical properties and parameters while maintaining a region of lowered capacitance of at least half the active area.

FIG. 1-A shows a prior art unidirectional OVP thyristor comprising three junctions between n and p type material. A first junction 100 is formed between n-type region 102 and p-type region 104. A second junction 106 is formed between p-type region 104 and n-type substrate 108. A third junction 110 is formed between n-type substrate 108 and p-type region 112.

FIG. 1-B depicts a visualization of the thyristor of FIG. 1-A with regions 104 and 108 separated into regions 104-104' and 108-108' coupled by links 130 and 132 respectively. The separation of regions 104 and 108 is a conceptual visualization to aid in understanding the operation of the device and not a physical separation. The visualization allows the thyristor to be modeled as two interconnected transistors shown in FIG. 1-C. An npn transistor 140 is regeneratively connected to a pnp transistor 142. A voltage source 146 and an impedance 148 are connected across the device between the anode (A) and the cathode (K). The device is gateless i.e. it only has an anode and cathode and no gate terminal.

I should be noted that it is possible to build a complementary structure starting out from a p-type substrate and wherein all the other layers have opposite polarity as well. The principal of operation of this invention is applicable to both types of devices.

The operation of the OVP device is now explained with reference to FIGS. 1-A to 1-C. When the voltage V across the device exceeds a breakdown voltage level, junction 106 between region 104 and 108 goes into avalanche breakdown. In this state, the device impedance is substantially low. When the current $I_A$, exceeds a latching current level, the device switches regeneratively to a very low-impedance, low-voltage on-state. In this state the current $I_A$ is set by the external circuit comprising voltage source 146 and impedance 148. Once latching occurs, the regenerative connection 144 between transistors 140 and 142 holds the device in a low impedance state until $I_A$ falls below a holding current level, whereafter the device reverts back to a high impedance off-state. It is desirable that an OVP thyristor have a relatively high holding current so that the device does not remain in a low impedance state when the transient has substantially passed. The holding current is largely due to the regenerative connection between transistors 140 and 142 and is increased by reducing the gain of one of these transistors. The gain of npn transistor 140 may be decreased by perforating emitter 102 with resistive shorts 114, thus setting the holding current to an acceptable level.

For OVP thyristors it is desirable to be able to exercise sufficient control over the avalanche breakdown mechanism so that devices suitable for use at a particular voltage may be predictably fabricated. Additionally, non-OVP thyristor junctions typically break down at very much higher voltages than required for many protection applications, so there is a need to decrease the breakdown voltage. Commonly in OVP devices, breakdown is set by doping the substrate 108 to a certain target concentration. In general to lower the breakdown voltage, more doping needs to be added to the more lightly doped side of a junction. For junction 106 in FIG. 1-A, the n-type region 108 is more lightly doped than p-type region 104 and hence, in order to lower the breakdown voltage, the doping in substrate 108 needs to be increased. However, the ability of a semiconductor material to hold charge at a given voltage is also increased with doping concentration and since capacitance depends on the amount of charge per volt across the junction, junction capacitance also increases with increasing doping concentration. Clearly the opportunity to reduce junction capacitance is limited by the conflicting need to increase the doping level in substrate 108 in order to achieve lower breakdown voltages.

An embodiment of the present invention is depicted in FIG. 2. Device 200 is bi-directional in that it has two four layer thyristors 202 and 204 in an anti-parallel (head to tail) configuration so that transients of both positive and negative polarity can be suppressed. Thyristors 202 and 204 are formed on a common n-type substrate 108 and are identical except for their opposing orientations.

As previously indicated, the breakdown occurs across junction 106, and depends on the relative concentrations of p-type and n-type regions defining the junction, a more abrupt junction resulting in a lowering of the breakdown voltage. By introducing a lightly over-doped buried n-plug region 206 in substrate 108 the junction 106 is moved to 106'. Region 206 is lightly over-doped with n-type impurities to the extent necessary to set a desired breakdown voltage for the junction 106'. Importantly, the inclusion of region 206 makes it possible to have very light doping in substrate 108 while still maintaining control over the breakdown voltage via the doping level of region 206.

The reduction of the doping level in substrate 108 is a first step in reducing the device capacitance. A second step involves reducing the abruptness of the change between p-type region 112 and n-type substrate 108 by introducing a p-type deep base region 208. Deep base region 208 is lightly doped with a graded impurity concentration, the concentration reducing towards its interface with substrate 108 at junction 110'. The capacitance of an idealized parallel plate capacitor is given by the equation:

$$C_T = \frac{\varepsilon A}{d} \quad \text{Equation 1}$$

where $\varepsilon$ is the permittivity, A is the junction area and d is the separation between the plates. Equation 1 may be adapted for the case of a semiconductor junction by substituting an effective junction width for plate separation d. The effective junction width depends on the extent of the depletion region across junction. A less steeply graded junction increases effective junction width for a given voltage, thus reducing the junction capacitance.

Figure 3:
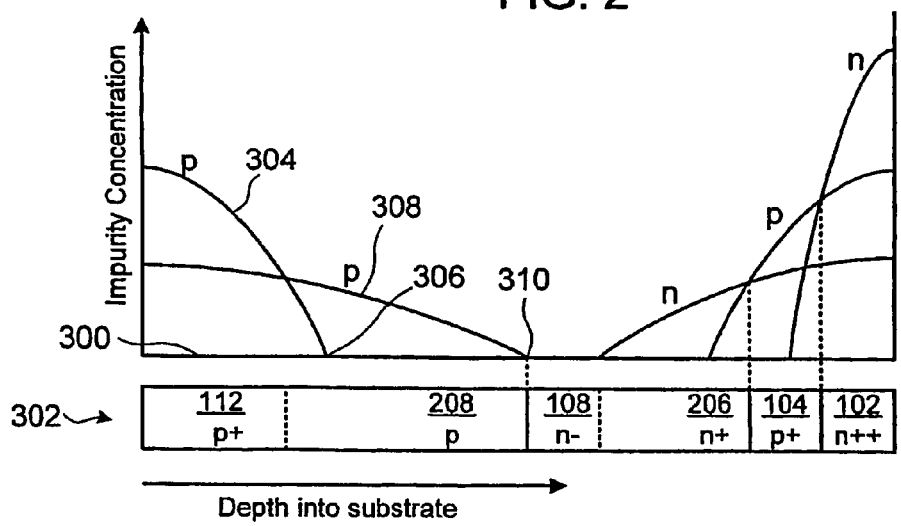
FIG. 3 is a graphical depiction of the doping concentrations along line 3-3 in FIG. 2.

The effect of deep base region 208 on capacitance is further explained with reference to FIG. 3, which graphically represents doping concentrations along line 3-3 in FIG. 2. In the graph the y-axis represents doping impurity concentration and the x-axis represents depth into the substrate 108. The concentration level along line 300 is the doping level of the substrate 108. For convenience the thyristor device is also schematically depicted below the graph at 302 to show clear correspondence between the various regions and the impurity concentration levels. The location of a junction is commonly defined as the point where p-type and n-type concentrations are equal.

Considering for a moment device 302 with no region 208 (i.e. region 208 has the concentration of the n-type substrate 108), the capacitance between region 112 and substrate 108 would be determined by the more abrupt change in doping level between concentration curve 304 and base line 300 at a point 306. The introduction of lightly doped deep base region 208 with a graded concentration curve 308 now places the junction at 310, with a correspondingly smaller concentration disparity and hence lower junction capacitance.

The introduction of n-plug region 206 also helps reduce overall capacitance by reducing the abruptness of the junction between region 104 and substrate 108. Furthermore, the junction area between regions 104 and substrate 108 is effectively reduced by the introduction of n-plug 206 thus resulting in correspondingly lower capacitance.

The overall capacitance of the device, being the combination of capacitances from the various junctions is thus reduced. Employing the techniques described in this application results in typical reductions in device capacitance of at least 25%. At the same time the surge current that the device can withstand is not reduced and in fact, may be improved. Advantageously, regions 208 and 206 focus the avalanche current into the active switching transistors. The resulting reduction in base width (region 108) speeds their switching so that improved surge capability, reduced capacitance, and consistent and accurate protection voltage control are all achieved.

The fabrication of the OVP thyristor 200 is described in relation to FIG. 2. In the depicted embodiment, back to back OVP thyristors 202 and 204 are fabricated on a common n-type substrate die 108. In one specific embodiment-the die size is 81×81 mills with a thickness of 8-9 mills and having a resistivity of 50 to 70 Ω-cm (1 mil is equivalent to $10^{-3}$ inches).

The deep base well regions 208 are formed first. Boron glass is pre-deposited and then driven-in at high temperature. Next the buried n-plugs 206 are formed by ion-implanting phosphorous dopant, followed by a second drive-in process at high temperature, which drives in the n-plug regions 206 and further drives in deep base region 208. The shallow base regions 104 and 112 are formed by implanting Boron followed by high-temperature drive-in. Emitter 102 is then diffused into the shallow base regions 104 and 112 followed by an emitter drive-in. Note that the n-type emitter 102 is masked to preserve p-type perforations 114 in order to set a sufficiently high holding current, as previously described.

The periphery of the device 200 is then etched away to form a moat 210, which is covered with photoglass 212. Aluminum layer 214 is then sputtered or evaporated over the shallow base/emitter regions to form intermediate electrical contacts, common to both thyristors 202 and 204. After sintering aluminum layers 214, a Titanium-Nickel-Silver (Ti—Ni—Ag) layer 216 is evaporated over the aluminum electrodes to provide a durable outer electrode. The device 200 may then be suitably packaged for its intended use e.g. in a surface mount package for use in DSL modems and the like.

While the fabrication of device 200 is depicted in terms of a n-type substrate, those of skill in the art will readily appreciate that an equivalent device can be fabricated starting out with a lightly doped p-type substrate. Additionally, while the depicted embodiment is shown as a bi-directional device, an OVP thyristor can equally well be fabricated as a unidirectional device as shown in FIG. 1.

Figure 4:
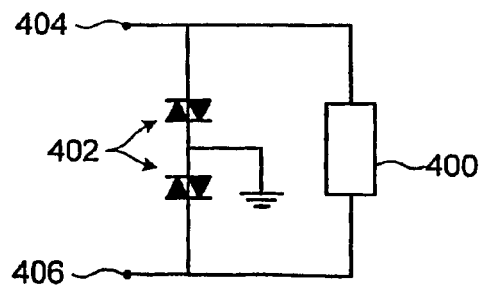
FIG. 4 is a schematic circuit diagram of an OVP thyristor application.

A common mode of usage of an OVP thyristor is shown in FIG. 4, where it is desired to protect sensitive telecommunications equipment 400 such as a DSL modem, fax or telephone. Bi-directional OVP thyristors 402 are connected between TIP line 404 and ground and the RING line 406 and ground. Transients resulting from lightning or other effects are likely to be carried into the equipment 400 via lines 404 and 406 in absence of thyristor 402. Thyristors 402 are selected to have suitable peak surge current, and a breakdown voltage that is selected to adequately protect equipment 400.

Advantageously, the thyristors fabricated in accordance with the present invention have lowered capacitance while not sacrificing peak surge current ratings.

As will be apparent to those skilled in the art in light of the foregoing disclosure, many alterations and modifications are possible in the practice of this invention without departing from the spirit or scope thereof.

What is claimed is:

1. An over-voltage protection thyristor device, comprising:
    a substrate semiconductor material of a first conductivity type, the substrate having a first outer surface and a second outer surface;
    a first shallow base region of a second conductivity type extending from the first outer surface into the substrate;
    a second shallow base region of a second conductivity type extending from the second outer surface into the substrate;
    an emitter of the first conductivity type extending from the first outer surface into the shallow base region, the emitter having a depth that is less than the first shallow base region;
    a deep base region of the second conductivity type extending into the substrate from the second shallow base region, the deep base region having a graded doping concentration reducing into the substrate such that the capacitance between the deep base region and the substrate is reduced; and
    a buried plug region of the first conductivity type vertically aligned with the emitter and extending from the first shallow base region into the substrate, the buried region having a higher doping concentration than the substrate.

2. An over-voltage protection thyristor device according to claim 1, wherein the doping concentration in the buried region is selected in accordance with a desired breakdown voltage for the over-voltage protection thyristor device.

3. An over-voltage protection thyristor device according to claim 2, wherein the buried region is at least 86 microns deep.

4. An over-voltage protection thyristor device according to claim 1, wherein the buried region has substantially the same lateral extent as the first shallow base region.

5. An over-voltage protection thyristor device according to claim 1, wherein the buried region and the deep base region are plug shaped regions and the device comprises a pair of laterally separated anti-parallel thyristors formed on a common substrate.

6. An over-voltage protection thyristor device according to claim 5, wherein the first shallow base region of one of the pair of thyristors extends to the second shallow base region of the other of the pair of thyristors and, the deep base region of each of the devices extending into the substrate beyond the respective second shallow base regions.

7. An over-voltage protection thyristor device according to claim 1, wherein the substrate has a low doping concentration.

8. An over-voltage protection thyristor device according to claim 1, wherein the first conductivity type semiconductor material comprises n-type impurities and the second conductivity type semiconductor material comprises p-type impurities.

9. An over-voltage protection thyristor device according to claim 1, wherein the first conductivity type semiconductor material comprises p-type impurities and the second conductivity type semiconductor material comprises n-type impurities.

10. An over-voltage protection thyristor device according to claim 1, wherein the emitter region has a plurality of perforations therethrough, the first shallow base region extending through the perforations to the first outer surface.

11. An over-voltage protection thyristor device according to claim 10, wherein the size and number of perforations in accordance with a desired holding current for the device.

12. An over-voltage protection thyristor device according to claim 1, wherein the first and second shallow base region is between 29 and 33 microns deep.

13. An over-voltage protection thyristor device according to claim 1, wherein the deep base region is between 109 and 130 microns deep.

14. An over-voltage protection thyristor device according to claim 1, wherein the emitter is between 9 and 12 microns deep.

15. An over-voltage protection thyristor device according to claim 1, comprising a conductive electrode layer on each of the first and second outer surfaces.

16. An over-voltage protection thyristor device according to claim 15, wherein the conductive electrode layer comprises aluminum.

17. An over-voltage protection thyristor device according to claim 16, comprising one or more protective outer layers selected from the group consisting of titanium, nickel and silver.

18. An over-voltage protection thyristor device according to claim 1, used for protecting electrical equipment from line transients.

19. A method of fabricating an over-voltage protection thyristor device on a substrate semiconductor material of a first conductivity type, the substrate having a first outer surface and a second outer surface, the method comprising:

forming a deep base region of a second conductivity type extending from the second outer surface of the substrate, the deep base region having a graded concentration reducing into the substrate such that the capacitance between the deep base region and the substrate is reduced;

forming a buried plug region of the first conductivity type extending from the first outer surface of the substrate, the buried plug region having a higher doping concentration than the substrate;

forming a first shallow base region of the second conductivity type extending from the first outer surface into the substrate on top of the buried plug region;

forming a second shallow base region of the second conductivity type extending from the second outer surface into the substrate on top of the deep base region;

forming an emitter of the first conductivity type extending from the first outer surface into the shallow base region, the emitter having a depth that is less than the first shallow base region vertically aligned with the buried plug region.

20. A method according to claim 19, wherein forming the buried region comprises doping the substrate with phosphorous.

21. A method according to claim 19, wherein forming the first and second shallow base regions comprises doping the substrate with boron.

22. A method according to claim 19, wherein forming the emitter comprises overdoping the first shallow base region with impurities of the first conductivity type.

23. A method according to claim 22, wherein the impurities of the first conductivity type comprise phosphorous.

24. A method according to claim 19, wherein forming the deep base region comprises doping the substrate with boron.

* * * * *